United States Patent [19]

Saida et al.

[11] 3,925,120

[45] Dec. 9, 1975

[54] METHOD FOR MANUFACTURING A SEMICONDUCTOR DEVICE HAVING A BURIED EPITAXIAL LAYER

[75] Inventors: Hiroji Saida, Hachioji; Yuichi Ono; Masayoshi Nomura, both of Kokubunji; Masao Tamura, Hachioji; Hirotsugu Kozuka, Tokyo, all of Japan

[73] Assignee: Hitachi, Ltd., Japan

[22] Filed: July 11, 1974

[21] Appl. No.: 487,659

Related U.S. Application Data

[60] Division of Ser. No. 295,873, Oct. 10, 1972, abandoned, which is a continuation of Ser. No. 83,526, Oct. 23, 1970, abandoned.

[30] Foreign Application Priority Data

Oct. 27, 1969 Japan .............................. 44-85231
Mar. 13, 1970 Japan .............................. 45-20884

[52] U.S. Cl. .................... 148/175; 29/571; 29/578; 29/580; 148/187; 156/17; 357/20; 357/23; 357/42; 357/48; 357/52

[51] Int. Cl.² .................. H01L 29/34; H01L 21/74; H01L 29/06

[58] Field of Search ........ 148/175, 187; 357/20, 23, 357/42, 48, 52; 29/571, 578, 580; 156/17

[56] References Cited

UNITED STATES PATENTS

| | | | |
|---|---|---|---|
| 3,370,995 | 2/1968 | Lowery et al. | 148/175 |
| 3,514,845 | 6/1970 | Legat et al. | 29/571 |
| 3,551,760 | 12/1970 | Tokuyama et al. | 357/52 X |
| 3,740,276 | 6/1973 | Bean | 148/175 |
| 3,753,803 | 8/1973 | Nomura et al. | 148/175 |
| 3,764,409 | 10/1973 | Nomura et al. | 148/175 |

FOREIGN PATENTS OR APPLICATIONS

| | | | |
|---|---|---|---|
| 1,144,850 | 3/1969 | United Kingdom | 148/175 UX |

*Primary Examiner*—L. Dewayne Rutledge
*Assistant Examiner*—W. G. Saba
*Attorney, Agent, or Firm*—Craig & Antonelli

[57] ABSTRACT

A semiconductor device is formed by providing a p-type semiconductor substrate, a buried n-type epitaxial layer grown in a recess provided on said semiconductor substrate, and an impurity diffused layer provided on a closed band region which is located on the boundary between said semiconductor substrate and said buried epitaxial layer and extends on both sides over both the surfaces of said semiconductor substrate and said buried epitaxial layer. When said semiconductor device is applied to a complementary MOS type integrated circuit, said impurity diffused layer can serve as a channel stopper for a MOS type transistor provided on the buried epitaxial layer.

12 Claims, 20 Drawing Figures

INVENTORS

HIROJI SAIDA, YUICHI ONO, MASAYOSHI NOMURA, MASAO TAMURA AND HIROTSUGU KOZUKA

BY

Craig, Antonelli, Stewart & Hill

ATTORNEYS

INVENTORS

HIROJI SAIDA, YUICHI ONO,
MASAYOSHI NOMURA, MASAO TAMURA
AND HIROTSUGU KOZUKA

BY Craig, Antonelli, Stewart & Hill
ATTORNEYS

INVENTORS
HIROJI SAIDA, YUICHI ONO,
MASAYOSHI NOMURA, MASAO TAMURA,
AND HIROTSUGU KOZUKA
BY
Craig, Antonelli, Stewart & Hill
ATTORNEYS

METHOD FOR MANUFACTURING A SEMICONDUCTOR DEVICE HAVING A BURIED EPITAXIAL LAYER

This is a division of of application Ser. No. 295,873 filed Oct. 10, 1972, now abandoned, which is a continuation of Ser. No. 83,526 filed Oct. 23, 1970, now abandoned.

BACKGROUND OF THE INVENTION

1. Field of the Invention

The present invention relates to a semiconductor device comprising an epitaxial layer which is formed in a recess provided on the surface of a semiconductor substrate and has the conductivity type opposite to that of the substrate, that is, a semiconductor device comprising a buried epitaxial layer.

2. Description of the Prior Art

A device has been proposed in which junctions are formed by the process of burying an epitaxial layer instead of stacking it. The manufacturing process of this device is as follows. First, a protective layer being of such a material as $Si_3N_4$, $SiO_2$, etc. and having a window is formed on the principal surface of a crystal substrate, next, a recess is formed by gas or liquid etching on the substrate surface exposed through the window, and finally, an epitaxial layer of the conductivity type opposite to that of the substrate is grown through the window in the recess on the substrate surface. In this case, however, some defects in the smoothness and crystal structure are apt to be produced at the end portion of the epitaxial layer, therefore, this manufacturing method has the disadvantages that, when a pn junction is formed in the above-described portion, the reverse-direction characteristics exhibit soft breakdown or the leakage current increases, and when a transistor is formed, the noise characteristics are caused to be deteriorated.

SUMMARY OF THE INVENTION

An object of the present invention is to provide the above-mentioned a semiconductor device comprising a buried epitaxial layer and more generally a semiconductor device in which the above-mentionned disadvantages are eliminated.

Another object of the present invention is to provide a complementary MOS type integrated circuit having excellent electric characteristics.

Still another object of the present invention is to provide a method for manufacturing a semiconductor device with a buried epitaxial layer and a complementary MOS type integrated circuit which have excellent electric characteristics.

Still another object of the present invention is to provide a semiconductor device with a buried epitaxial layer having excellent electric characteristics, specifically excellent in noise characteristics.

The present invention is based on the concept that the undesirable electric characteristics of a semiconductor device with an epitaxial layer according to the prior art mainly result from the crystal defects produced at the end portion of the epitaxial layer. And the gist of the present invention consists in that an impurity diffused layer having the conductivity type identical or opposite to that of said epitaxial layer is provided on a closed band region which is located on the boundary between the semiconductor substrate and the buried epitaxial layer and extends on both sides over both the surfaces of the semiconductor substrate and the buried epitaxial layer, thereby to shift a pn junction near the surfaces from the boundary surface between the epitaxial layer and the substrate. Further, it has been found that, in case of manufacturing the semiconductor device, the noise characteristics can be improved by weakly treating by chemical or gaseous etching the surfaces of the substrate and the buried epitaxial layer before the provision of said diffused layer.

The impurity diffused layer in accordance with the present invention cannot only be applied to a diode, but also to a buried transistor having a collector layer serving also as isolation and to a complementary MOS type integrated circuit. When the present invention is applied to a complementary MOS type integrated circuit, the advantage can be obtained that said impurity diffused layer serves as a channel-stopper of the MOS transistor provided on the epitaxial layer.

The above and other features and advantages of the present invention will be apparent from the following detailed description regarding the embodiments taken in conjunction with the accompanying drawings.

DESCRIPTIONS OF THE PREFERRED EMBODIMENTS

Figure 1:
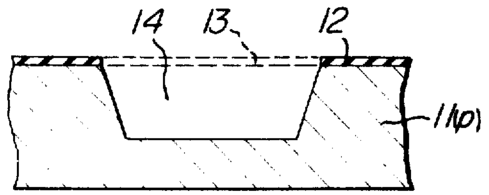
FIG. 1 PRIOR ART
FIGS. 1 and 2 are schematic diagrams illustrating the manufacturing process of a semiconductor device having a buried epitaxial layer in accordance with the prior art.
Figure 2:
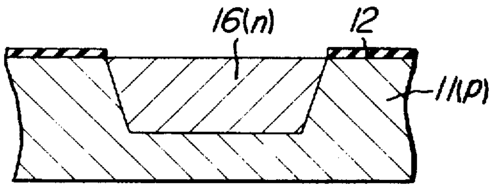
FIG. 2 PRIOR ART

FIGS. 1 and 2 are schematic diagrams illustrating a semiconductor device with a buried epitaxial layer in accordance with the prior art and its manufacturing process.

Figure 3:
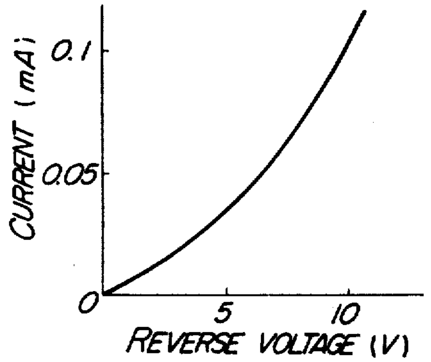
FIG. 3 PRIOR ART
FIG. 3 is a graph illustrating the reverse-direction characteristic of said device in accordance with the prior art.

Referring to FIG. 1, a protecting layer 12 of such a material as $Si_3N_4$ or $SiO_2$ is formed on the {100} surface of a p type Si crystal substrate 11 doped with B having a specific resistance of 10 to 20Ω-cm by a known process such as thermal decomposition of a mixed gas of $SiH_4$ and $NH_3$ or $SiH_4$ gas. Next, only a predetermined region 13 of the protecting layer is removed by photoetching and, after that, a recess 14 having an area of 8 × 125 $\mu^2$ and a depth of 5$\mu$ is formed on the substrate 11 by gaseous or chemical etching using HCl. Then, as shown in FIG. 2, a buried epitaxial layer 16 of an n-type is grown epitaxially with impurity As being introduced by $H_2$ reduction process of $SiCl_4$ until the surface of the epitaxial layer 16 reaches the level of the substrate surface. In FIG. 3, a reverse-direction characteristic curve measured between the electrodes provided on the p-type crystal substrate 11 and the *n*-type epitaxial layer 16, respectively, is shown.

The reason why a diode having a buried epitaxial layer in accordance with the prior art exhibits a soft breakdown as shown in FIG. 3 may certainly be that roughness and crystal defects are produced near the boundary surface between the epitaxial layer and the substrate.

Figure 4:
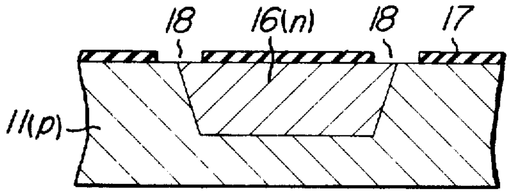
FIGS. 4 and 5 are schematic diagrams illustrating a semiconductor device and its manufacturing process in accordance with the present invention.

Embodiment 1:

After the prior art manufacturing process as shown in FIGS. 1 and 2, the protecting layer 12 on the semiconductor substrate 11 is removed, and a protecting layer 17 of such a material as $Si_3N_4$ or $SiO_2$ is again formed by a known method as described in FIG. 4.

Figure 5:
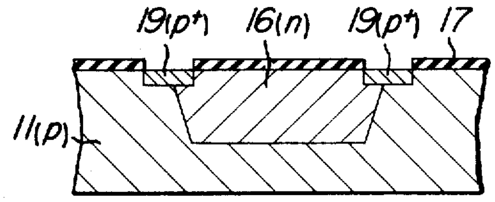
Figure 6:
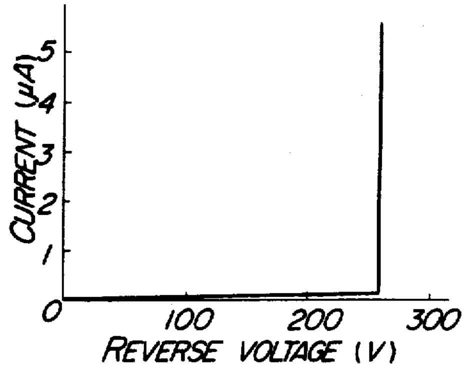
FIG. 6 is a graph illustrating the reverse-direction characteristic of the semiconductor device as shown in FIG. 5 in accordance with the present invention.

After that, only a closed band region 18 is removed from the protecting layer 17 by a photoetching process, which region includes the boundary between the semiconductor substrate 11 and the buried epitaxial layer 16. As shown in FIG. 5, B is diffused into the band region to provide a $p^+$-type diffused layer 19 of about 0.5$\mu$ in thickness. In FIG. 6, a reverse-direction characteristic curve measured between the electrodes provided on the p-type crystal substrate 11 and n-type epitaxial layer 16, respectively is shown. A remarkable improvement can be found in FIG. 6 as compared with FIG. 3. It is required that the thickness of the diffused layer is more than 0.5$\mu$ in order to make the remarkable improvement as shown in FIG. 6. This is because the lattice defects produced near the boundary of the layer epitaxially grown on the surface of the substrate are distributed to a depth of 5$\mu$ and the provision of the diffused layer 19 shifts the p-n junction from a region of many lattice defects to that of few lattice defects to bring about the improved reverse-direction characteristic as shown in FIG. 6.

Figure 7:
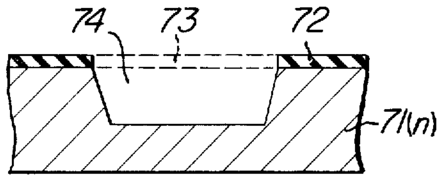
FIGS. 7 to 11 are schematic diagrams illustrating the manufacturing process of a buried transistor with a collector layer serving also as an isolation.
Figure 8:
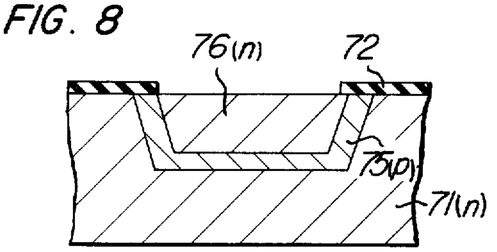
Figure 9:
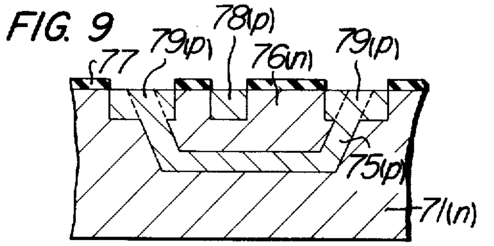
Figure 10:
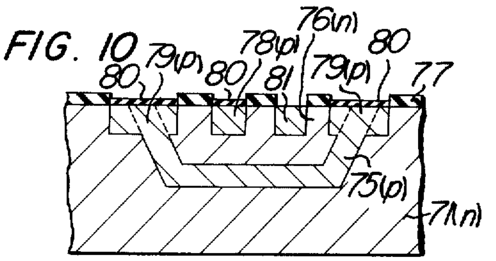
Figures 11, 16:
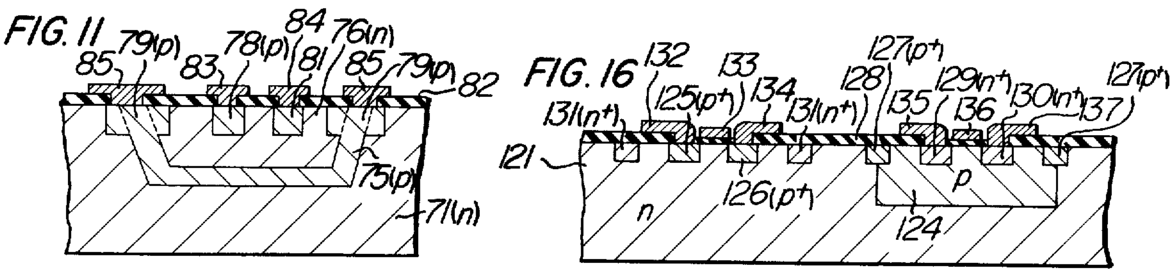

Embodiment 2:

As illustrated in FIG. 7, a protecting layer 72 of such material as $Si_3N_4$ or $SiO_2$ is formed by a known method on the {100} surface of an n-type single crystal substrate 71, and, after removing by etching only a predetermined region 73 in the protecting layer, a recess 74 is formed in the semiconductor substrate 71 by gaseous or chemical etching using HCl. Next, as illustrated in FIG. 8, B is diffused at 1,000°C into the surface layer of the recess by the known selective diffusion method to form a high-concentration p-type region 75. The region 75 serves not only as a collector layer, but also as an isolation. Then, an n-type buried epitaxial layer 76 is grown epitaxially with impurity being introduced by the $H_2$ reduction process of $SiCl_4$ until the surface of the epitaxial layer 76 reaches the level of the substrate surface. Next, the protecting layer 72 on the semiconductor substrate which has been treated as described above is removed and a protecting layer 77 of $SiO_2$ is formed by a known method as illustrated in FIG. 9, and after that, windows for an emitter portion 78 and a collector portion 79 are provided through the protecting layer 77 by a photoetching process. In this case, the window for the collector portion 79 must be made in such a manner that it includes not only the entire surface of region 75, but also parts of the surface of the semiconductor substrate 71 and the surface of the buried epitaxial layer 76, respectively. High concentration boron is diffused through the windows into the regions 78 and 79. Said diffused layers must have the same conductivity type as that of the region 75 because of the provision of electrode for the collector portion. Then, as shown in FIG. 10, after a protecting layer 80 of $SiO_2$ being formed on the emitter portion 78 and the collector portion 79, a window for a base-contact portion 81 is provided through the protecting layer 77 so that phosphor may be diffused. Following that, as shown in FIG. 11, the $SiO_2$ protecting layers 77 and 80 are removed and a new $SiO_2$ protecting layer 82 is formed by the chemical vapor deposition method. Finally, windows for electrodes are made by a photo-etching method and, after that, aluminium of about 7,000A in thickness is evaporated so that an emitter electrode 83, a base electrode 84 and a collector electrode 85 may be left by the photo-etching method.

In the manufacturing process of the abovedescribed p-n-p transistor, when the diffused layer 79 is not provided, the reverse-direction characteristic in the collector junction exhibits a soft-breakdown of about 0.7 $\mu$A at a reverse-direction voltage of 50V, whereas, when the diffused layer 79 is provided in accordance with the present invention, the reverse-direction characteristic exhibits an excellent curve as shown in FIG. 6 in which the breakdown voltage is 60V.

While the description is made with respect to a p-n-p transistor in this embodiment, it is also possible with respect to an n-p-n transistor which is similar to the transistor above in constitution to bring about the same effect by providing the diffused layer in accordance with the present invention.

It is true that, in a buried transistor of the prior art, after the growth of an epitaxial layer, diffusion for mounting electrodes has been again made into the surface of a collector layer serving also as an isolation. However, it is not intended to diffuse impurities over the entire surface of the collector portion which also serves as the isolation including parts of the surfaces of a substrate and the buried epitaxial layer, respectively, as in the present invention, but is intended to mount electrodes, and therefore, this diffusion has not any effect as brought about in accordance with the present invention.

Embodiment 3:

A buried epitaxial layer is formed just as in Embodiment 2. Then, the protecting layer is moved and the surface is chemically etched to a depth of about 0.5 $\mu$ by a mixture solution of hydrofluoric acid and nitric acid, and after that, emitter, collector and base diffusions are respectively made so that connections for the electrodes may be made. The chemical etching as described above are very effective in improving the noise characteristics.

In this embodiment, description is made only with respect to a diode, p-n-p type transistor and n-p-n type transistor of silicon. However, the present invention can be applied effectively not only to a more complicated IC, resistor element, capacitor element, MOSIC and the like, but also to elements using Ge or compound semiconductors such as GaAs and GaP as well as to a heteroepitaxial layer such as of Si in a sapphire substrate and GaAs in a Ge substrate.

Embodiment 4:

In FIGS. 12 to 16, there is shown an embodiment of the present invention as applied to a complementary MOS integrated circuit having an n-type silicon substrate on which are provided a p-type buried epitaxial layer and an impurity diffused layer serving also as a $p^+$ channel stopper in accordance with the present invention.

Figure 12:
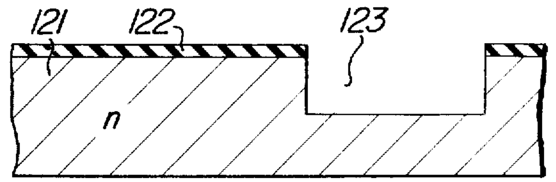
FIGS. 12 to 16 are schematic diagrams illustrating the manufacturing process of a complementary MOS type integrated circuit in accordance with the present invention.
Figure 13:
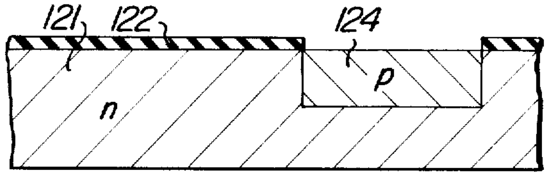

A protecting layer 122 of such a material as $Si_3N_4$ and $SiO_2$ is applied on the {100} surface of an n-type substrate 121 having a specific resistance of 1 to 2Ωcm, a widow is made on the surface by photo-etching, and a recess 123 is formed to a depth of 4.5 to 5μ by gaseous or chemical selective etching, as shown in FIG. 12.

An epitaxial layer 124 is grown in the recess 123 using $SiCl_4 + H_2$ or $SiH_4 + H_2$ gas mixed with a small amount of etching gas (such as HCl, HBr and HI). The mixing with a small amount of etching gas has the advantage that silicon polycrystals do not adhere to the protecting layer of a mask during the growth of the epitaxial layer. $B_2H_6$ is added to a gas for growing and the epitaxial layer 124 is of the p-type and has a specific resistance of 0.5 to 0.6Ωcm in FIG. 13.

Figure 14:
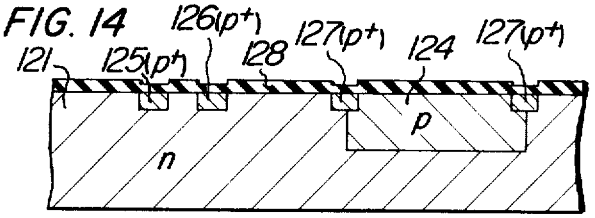

After a protecting layer is again applied to the surface, windows are formed at predeterined places, and boron is diffused through the windows into areas 125 and 126 of the n-type substrate 121 and into an area 127 including the boundary between the substrate 121 and the epitaxial layer to form $p^+$-type portions having a surface concentration of about $3 \times 10^{19}$ $cm^{-3}$ and a depth of 2 to 3 μ. Then, the $p^+$-type portion 127 on the boundary is formed so as to surround the p-type buried layer 124 and to include the surface of the boundary because the portion 127 improves the junction characteristics in addition to serving as a channel stopper. FIG. 14 shows the structure as described above, in which 128 is the newly applied protecting layer.

Figure 15:
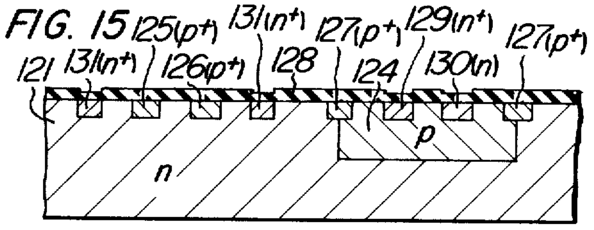

Referring to FIG. 15, windows are formed by photoetching and phosphor is diffused through the windows to form $n^+$ portions 129 and 130 having a surface concentration of about $1 \times 10^{19}$ $cm^{-3}$ and a depth of about 2 to 3μ on the p-type buried layer 124. If necessary, then, $n^+$ portions 131 are also formed on the n-type substrate 121 to serve as channel stoppers.

Referring to FIG. 16, the protecting layer of the portion which serves as the gate of the MOS transistor is reformed (for example, a layer of $SiO_2$ having a thickness of 1,200 to 1,400A is formed by phosphor treatment), and holes are made by photoetching for connecting with metal such as Al so that a p-channel MOS transistor on the n-type substrate 121 and an n-channel MOS transistor on the p-type buried epitaxial layer 124, respectively, may be formed. 132, 133 and 134 are, respectively, the source, gate and drain electrodes of the p-channel MOS transistor. 135, 136 and 137 are, respectively, the source, gate and drain electrodes of the n-channel MOS transistor.

Figure 17:
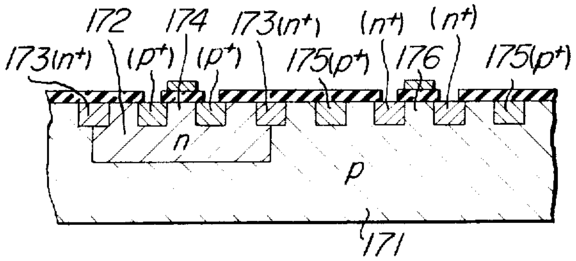
FIG. 17 is a schematic diagram illustrating a cross section of a complementary MOS type integrated circuit having the conductivity type opposite to the semiconductor device as shown in FIG. 16.

Embodiment 5:

In FIG. 17, there is shown another embodiment of the present invention as applied to a complementary MOS integrated circuit having a conductivity type opposite to that of Embodiment 4 and having a p-type silicon substrate on which are provided an n-type buried layer and an impurity diffused layer which serves also as an $n^+$ channel stopper.

An n-type buried epitaxial layer having a specific resistance 1 to 2Ωcm is formed in a p-type substrate having a specific resistance of 0.5 to 0.6Ωcm and an $n^+$-type diffused layer is formed on the surface of the boundary between the p-type substrate and the n-type buried epitaxial layer. In FIG. 17, 171 is the p-type substrate, 172 is the n-type buried epitaxially grown layer, 173 is the channel stopper of a p-channel MOS transistor 174, and 175 is the channel stopper of the n-channel MOS transistor 176.

Figure 18:
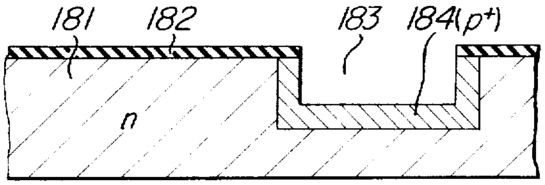
FIGS. 18 and 19 are schematic diagrams illustrating the manufacturing process of another complementary MOS type integrated circuit.
Figure 19:
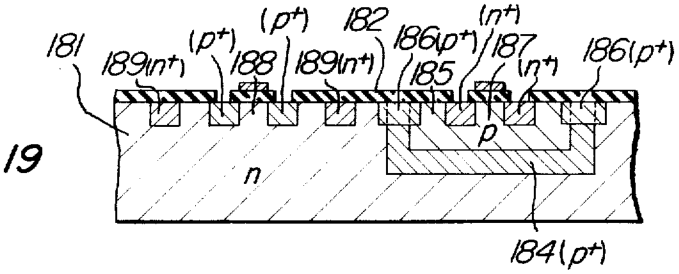

Embodiment 6:

In FIGS. 18 and 19, there is shown still another embodiment of the present invention as applied to a complementary MOS integrated circuit having an n-type silicon substrate on which are provided a p-type buried layer and an impurity diffused layer in accordance with the present invention serving also as a $p^+$ channel stopper.

A protecting layer 182 is applied on the surface of an n-type substrate 181 just as in Embodiment 4 and a recess 183 is provided on the n-type substrate 181 by selective etching by utilizing the protecting layer 182 as a mask.

A $p^+$ region 184 having a thickness of 3 to 4μ is formed by diffusion or epitaxial growth.

A p-type buried epitaxial layer 185 is formed just as in Embodiment 4, and a $p^+$ region and an $n^+$ region are formed by selective etching. Then, the $p^+$ region 186 for a channel stopper is adapted to include the junction on the surface of the boundary region. The formation of a gate insulator, metal connection and the like are made just as in Embodiment 4. 187 is an n-channel MOS transistor, 189 is the channel stopper of a p-channel MOS transistor 188.

Figure 20:
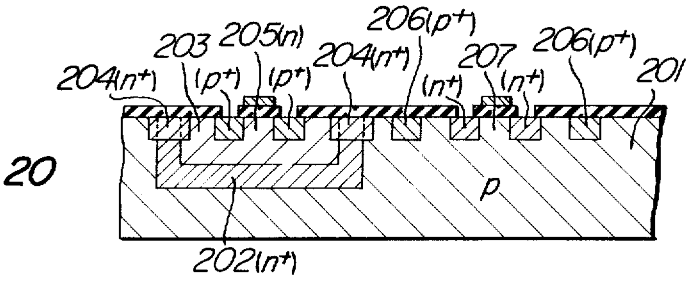
FIG. 20 is a schematic diagram illustrating a cross section of a complementary MOS type integrated circuit having the conductivity type opposite to the semiconductor device as shown in FIG. 19.

Embodiment 7:

In FIG. 20, there is shown further still another embodiment of the present invention as applied to a complementary MOS integrated circuit having a conductivity type opposite to that of Embodiment 6 and having a p-type silicon substrate on which are provided an n-type buried layer and an impurity diffused layer in accordance with the present invention serving also as an $n^+$ channel stopper. 201 is a p-type substrate, 202 is an $n^+$ layer formed by diffusion or epitaxial growth on the surface of a recess provided on the surface of the p-type substrate. 203 is an n-type layer grown in the recess to the level of the surface of the substrate by the process of selective epitaxial growth, 204 is the channel stopper of a p-channel MOS transistor 205, and 206 is the channel stopper of an n-channel MOS transistor 207.

The above-described embodiments are concerned only with silicon semiconductors. However, the process of the present invention can be equally well applied to those of germanium and compounds such as GaAs and GaP. Further, the conduction type and the values of specific resistance as described in the embodiments are only intended to exemplify the present invention, and it is to be noted that these can be appropriately changed according to the desired characteristics.

The features of a complementary MOS type integrated circuit having an impurity diffused layer in accordance with the present invention are as follows:

1. As buried islands having a conductivity type opposite to that of the substrate are formed epitaxially, it is easy to provide islands having a high specific resistance (low impurity concentration) on any desired region and with a common surface with the substrate (planar type), that is, it is possible to form with good reproducibility islands having a surface of such a high specific resistance which is impossible to make by diffusion process.

2. As the surface of a p-n junction formed at the boundary of a substrate and a buried epitaxial layer is included in a diffused layer of high impurity concentration, the junction characteristics are improved and the island (buried epitaxial layer) is completely electrically isolated from the substrate.
3. As the diffused layer including the abovedescribed layer also serves as a channel stopper of a MOS transistor, it is not necessary to carry out diffusion particularly for a channel stopper and as a result, the process is simplified.
4. As a result of the features as described in (1), (2) and (3), the yield rate of the products is good and great advantages are obtained industrially in manufacturing comlementary MOS type integrated circuits.
5. The embodiments of the present invention described in Embodiments 2 and 4 as applied to the process of manufacturing a buried n-type island by epitaxial growth can hardly be obtained by the diffusion process because it is very difficult to form an n-type island of low impurity concentration. Therefore, in this case, the present invention is especially advantageous.
6. The substrate of an n-channel MOS transistor, when it is formed on a p-type substrate, serves as an earth as a result of its circuit constitution, therefore, also the stem connected to the substrate serves as an earth. This brings about great practical advantages.
7. When a high impurity concentration layer is formed in a recess provided on a substrate, the depletion layer resulting from the reverse-direction voltage applied to the p-n junction formed between the substrate and the high impurity concentration layer extends for the most part to the substrate side, so it becomes possible to decrease the thickness of a buried epitaxial layer allowing the design of the elements to be simplified.

We claim:

1. A method of manufacturing a semiconductor device comprising the steps of:

a. preparing a semiconductor substrate;
b. providing a recess in the surface of said semiconductor substrate;
c. epitaxially growing a layer in said recess to form an epitaxial layer embedded in and coplanar with said semiconductor substrate and having a conductivity type opposite to that of said semiconductor substrate; and
d. diffusing an impurity into a closed loop region which extends over the edge of the junction layer between said semiconductor substrate and said embedded epitaxial layer and which extends beyond the junction layer to the surface of the semiconductor substrate and to the surface of said embedded epitaxial layer.

2. A method of manufacturing a semiconductor device as defined in claim 1, in which said method further comprises the step of etching both the surfaces of said substrate and said epitaxially grown layer before said step of diffusing an impurity into said closed loop region.

3. A method of manufacturing a semiconductor device as defined in claim 1, in which said method further comprises the steps of:

e. forming a MOS type transistor by providing a source, a drain and a gate in said embedded epitaxial layer;
f. forming another MOS type transistor by providing a source, a drain and a gate on said semiconductor substrate; and
g. providing around said another MOS type transistor a heavily doped diffusion layer having the same conductivity type as that of the semiconductor substrate.

4. A method of manufacturing a semiconductor device as defined in claim 3, in which the first-mentioned MOS type transistor and said diffused closed loop region are provided simultaneously.

5. A method of manufacturing a semiconductor device as defined in claim 3, in which said another MOS type transistor and said heavily doped diffusion layer are provided simultaneously.

6. A method for manufacturing a semiconductor device as defined in claim 1, in which the thickness of said closed loop region is at least $0.5\mu$.

7. A method for manufacturing a semiconductor device as defined in claim 1, in which said impurity diffused into said closed loop region is of the same type as that of said embedded epitaxial layer.

8. A method for manufacturing a semiconductor device as defined in claim 1, in which said impurity diffused into said closed loop region is of a type opposite to that of said embedded epitaxial layer.

9. A method of manufacturing a semiconductor device comprising the steps of:

a. preparing a semiconductor substrate having a first conductivity type and a high specific resistance;
b. providing a recess in the surface of said semiconductor substrate;
c. diffusing an impurity of a second conductivity type opposite to said first conductivity type to a high impurity concentration into the entire surface of said recess, so as to form a first semiconductor layer;
d. forming an embedded epitaxial layer in said recess by growing epitaxially a second semiconductor layer having said first conductivity type, until the surface of said second semiconductor layer coincides with that of said semiconductor substrate; and
e. diffusing an impurity of the second conductivity type into a closed loop region including parts of the surface of said substrate and said second semiconductor layer and the entire edge part of said first semiconductor layer which appears on the surface of said semiconductor substrate, said surface parts being adjacent to said edge part.

10. A method of manufacturing a semiconductor device as defined in claim 9, in which the thickness of said closed loop region is at least $0.5\mu$.

11. A method of manufacturing a semiconductor device as defined in claim 1, in which said method further comprises the steps of:

h. forming a MOS type transistor by providing a source, a drain, and a gate on said embedded epitaxial layer, and
i. forming another MOS type transistor by providing a source, a drain, and a gate on said semiconductor substrate.

12. A method for manufacturing a semiconductor device comprising the steps of:

a. preparing a semiconductor substrate of a first conductivity type;

b. forming a first mask having a window of a predetermined shape on a surface of said semiconductor substrate;

c. providing a recess in the surface of said semiconductor substrate by etching selectively said semiconductor substrate through said window;

d. growing epitaxially an embedded epitaxial layer of a second conductivity type opposite to said first conductivity type in said recess until the surface of said embedded epitaxial layer coincides with that of said semiconductor substrate, so as to form a p-n junction between said embedded epitaxial layer and said semiconductor substrate, whereby said embedded epitaxial layer contains lattice defects in a closed loop region at most 0.5$\mu$ deep which is located on the boundary between said embedded epitaxial layer and said semiconductor substrate and which extends over both the surface of the semiconductor substrate and the surface of said embedded epitaxial layer;

e. forming a second mask having a window on said region; and f. diffusing an impurity of one conductivity type selected from the group consisting of said first and second conductivity types into said region, so that the edge portion of said junction is shifted to a portion where lattice defects do not substantially exist.

* * * * *